US008780556B1

(12) United States Patent
Ditri

(10) Patent No.: US 8,780,556 B1
(45) Date of Patent: Jul. 15, 2014

(54) FLUID ACTUATED COOLING CARD RETAINER

(75) Inventor: John Ditri, Huntingdon Valley, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 184 days.

(21) Appl. No.: 13/429,658

(22) Filed: Mar. 26, 2012

(51) Int. Cl.
*H05K 7/20* (2006.01)

(52) U.S. Cl.
USPC ............... 361/698; 361/679.53; 361/679.54; 361/704; 361/707; 361/699; 165/80.2; 165/80.4; 165/80.5; 174/15.1; 439/197

(58) Field of Classification Search
USPC .......... 361/679.46–679.54, 688, 689, 698, 361/699, 714–728; 165/80.2, 80.4, 80.5, 165/104.33, 185; 439/61, 62, 67, 77, 191, 439/192, 196, 197, 493, 629–637, 541.5; 174/15.1, 15.2, 16.3; 62/259.2
See application file for complete search history.

(56) References Cited

U.S. PATENT DOCUMENTS

| | | | | |
|---|---|---|---|---|
| 2,978,666 A * | 4/1961 | McGregor | ............... | 439/197 |
| 3,366,916 A * | 1/1968 | Oktay | ............... | 439/197 |
| 3,594,707 A * | 7/1971 | Peterson, II | ............... | 439/59 |
| 3,971,186 A | 7/1976 | Havelka et al. | | |
| 4,480,287 A | 10/1984 | Jensen | | |
| 4,819,713 A | 4/1989 | Weisman | | |
| 4,829,402 A * | 5/1989 | Gewebler et al. | ............... | 361/692 |
| 4,938,279 A * | 7/1990 | Betker | ............... | 165/46 |
| 4,958,257 A * | 9/1990 | Wenke | ............... | 361/700 |
| 4,968,265 A * | 11/1990 | Fox, Jr. | ............... | 439/197 |
| 4,971,570 A | 11/1990 | Tolle et al. | | |
| 4,994,937 A | 2/1991 | Morrison | | |
| 5,002,496 A * | 3/1991 | Fox, Jr. | ............... | 439/197 |
| 5,057,968 A * | 10/1991 | Morrison | ............... | 361/700 |
| 5,222,668 A * | 6/1993 | Frankeny et al. | ............... | 439/197 |
| 5,245,508 A * | 9/1993 | Mizzi | ............... | 361/694 |
| 5,711,628 A * | 1/1998 | Fletcher | ............... | 403/5 |
| 5,813,876 A * | 9/1998 | Rutigliano | ............... | 439/260 |
| 6,071,137 A * | 6/2000 | Rutigliano | ............... | 439/197 |
| 7,193,850 B2 * | 3/2007 | Pal | ............... | 361/700 |
| 8,534,347 B2 * | 9/2013 | Denny et al. | ............... | 165/80.4 |
| 2010/0039770 A1 * | 2/2010 | Danello et al. | ............... | 361/691 |

* cited by examiner

*Primary Examiner* — Michail V Datskovskiy
(74) *Attorney, Agent, or Firm* — Howard IP Law Group, PC

(57) ABSTRACT

A retaining device for a printed circuit board includes an expandable bladder. The bladder is responsive to a source of pressurized fluid for selectively clamping a printed circuit board within a slot of an associated cooling and/or storage chassis. A method for retaining a circuit card within a chassis includes pressurizing a volume of fluid, and filling an expandable bladder with the pressurized fluid; wherein filling of the bladder causes its expansion and clamps a circuit card within the chassis.

15 Claims, 8 Drawing Sheets

FLUID ACTUATED COOLING CARD RETAINER

FIELD OF THE INVENTION

The present invention relates to circuit card retaining systems, and more specifically, to systems for retaining cooling printed circuit or wiring boards.

BACKGROUND

Adequate cooling for electronic equipment, in particular, equipment having a large number of printed wire/circuit boards (PWBs/PCBs) or "circuit cards", is critical for preventing damage and extending component service life. The large amount of heat generated by the components arranged on these cards often necessitates separate conductive cooling systems in order to control the operating temperature of the equipment. These cooling systems may comprise, for example, heat exchangers embodied as heat-conducting chassis or frames. These chassis may be air or liquid-cooled, or may simply comprise a large thermal capacity. Cards are traditionally held on their ends within slots formed on opposing "cold walls" of the chassis (see FIG. 1A).

Cards inserted into these cold wall slots are typically clamped in place along their opposing edges via expanding "wedge locks" or "card retainers" (see FIG. 1B). Conventional card retainers suffer from several significant drawbacks. For example, they do not exert uniform pressure along the length of the card edge(s) as a result of their multi-piece construction. This multi-piece construction is also not ideal for efficient heat conduction, and thus, heat sinking from the card primarily results only from conduction on a side opposite the card retainer and its contact with the cold wall. Moreover, these card retainers do not allow for easy extraction of the cards, or the retainers themselves, because they often do not fully contract back to their non-expanded height, even when properly unlocked. Finally, the active cooling in many of these systems comes from coolant channels formed in the chassis walls, which can be arranged at a relatively large distance from the card. This distance can lead to significant thermal rise between the fluid in the channels and the card edges.

Alternative systems and methods are desired for providing both improved card retention and cooling.

SUMMARY

According to an embodiment, a device for selectively retaining a printed wire board within a chassis is provided. The device includes an expandable bladder having a cavity formed therein for holding a volume of fluid. The cavity is in communication with a source of pressurized fluid via an inlet port formed on the bladder. The source of pressurized fluid operates to selectively expand the bladder, securing the printed wire board within the chassis.

In another embodiment, a circuit card retaining system is provided. The system includes a source of pressurized fluid, and a card retainer. The card retainer features an expandable bladder having a cavity formed therein for holding a volume of fluid. The cavity is in selective communication with the source of pressurized fluid for pressurizing and expanding the bladder.

A method for retaining a circuit card within a chassis is also described. The method includes pressurizing a volume of fluid, and filling a bladder with the pressurized fluid for expanding the bladder, clamping the circuit card within a chassis.

DETAILED DESCRIPTION

Figure 1A:
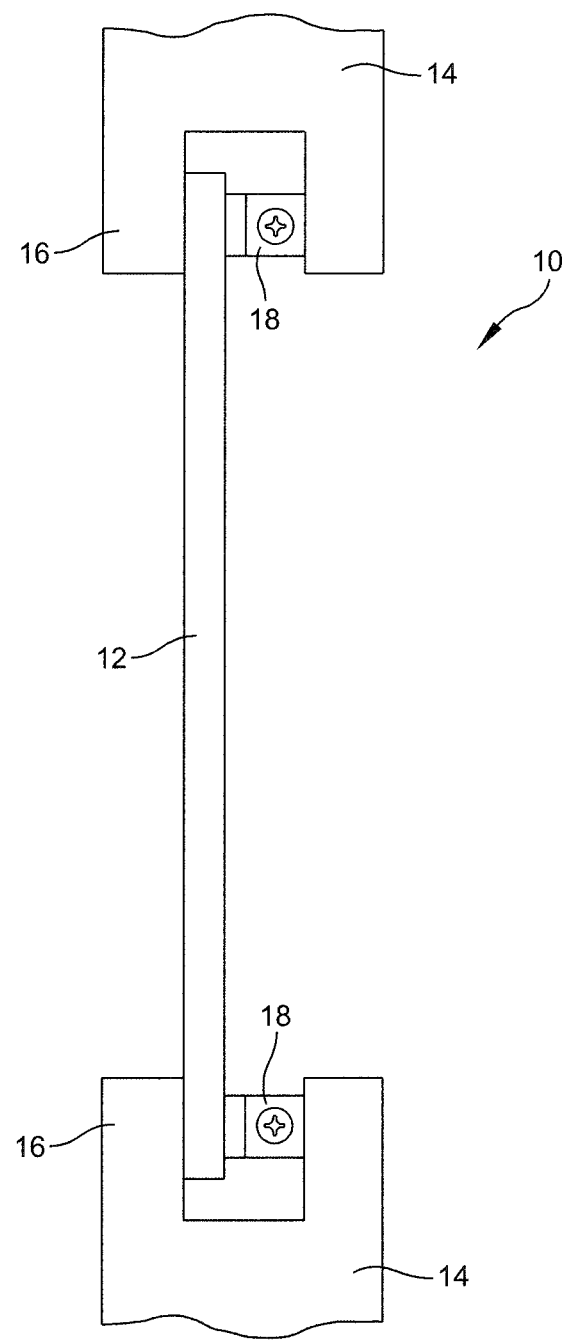
FIG. 1A is a front view of a card clamped between cold walls via card retainers according to the prior art.

It is to be understood that the figures and descriptions of the present invention have been simplified to illustrate elements that are relevant for a clear understanding of the present invention, while eliminating, for purposes of clarity, many other elements found in PWB/PCB retaining and/or cooling systems. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

FIG. 1A partially illustrates a card cooling system 10 using traditional expanding card retainers. The system includes a cooling chassis or frame 14 having a plurality of elevated wall sections 16 formed therein defining a plurality of slots. Each slot is configured to accept at least one card 12 (e.g. a PWB/PCB). Cards 12 are typically held within these slots by expanding card retainers or wedge locks 18. More specifically, card retainers 18 comprise expanding assemblies which clamp an edge of card 12 against, for example, an opposing wall of the slot.

Figure 1B:
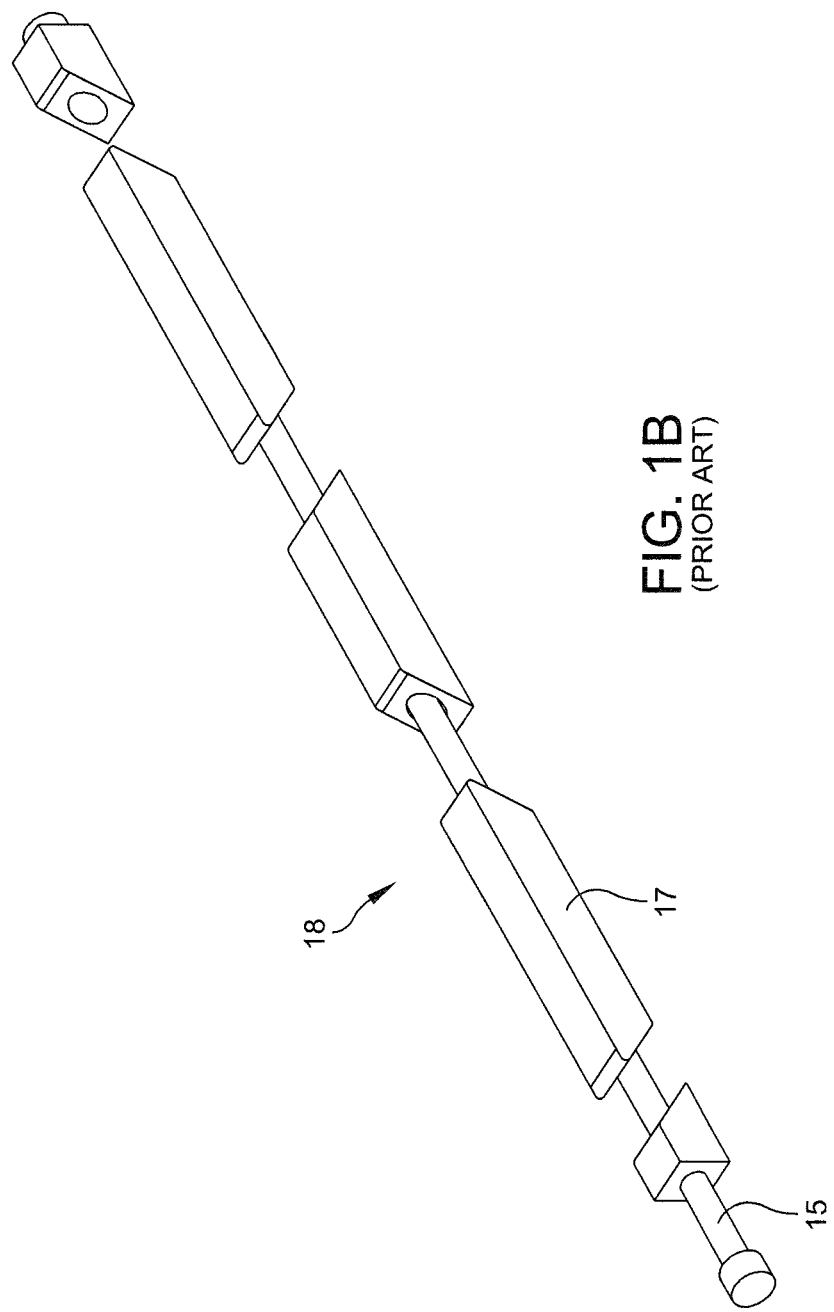
FIG. 1B is a perspective view of a card retainer of the prior art.

Referring generally to FIG. 1B, an exemplary expanding card retainer 18 is shown in more detail. Card retainer 18 may comprise, for example, a screw or bolt 15 configured to freely pass through several wedge-shaped body sections 17, including a front wedge, one or more center wedges and a rear wedge having a complementary threaded hole formed therein. Tightening of screw 15 forces sections 17 into contact, causing their displacement or "expansion" relative to one another. This expansion provides the locking function to hold the card between the retainer and the wall section of the cooling chassis. Similarly, removal of the card requires the loosening of the screw, allowing the wedge shape sections to "contract", or re-align, relative to one another, alleviating the force on the card. As set forth above, these card retainers have several drawbacks, including localized pressure on the card as a result of the separated body sections, inefficient heat transfer properties, as well as unreliable release characteristics.

Embodiments of the present invention include fluid actuated (e.g. pneumatically or hydraulically) card retainers which offer improved mechanical and thermal characteristics compared to card retainers of the prior art. An exemplary card retainer according to an embodiment of the present invention includes a fillable or inflatable bladder having at least one port for connecting to a supply of pressurized fluid such as air, water or other coolants. Like traditional card retainers, the bladder may be configured to be placed within a card slot of a cooling system, and selectively pressurized to secure the card within the slot. In one embodiment, the bladder may comprise at least two ports such that a circular flow off fluid may be supplied to the bladder, generating additional cooling of the card.

Figure 2A:
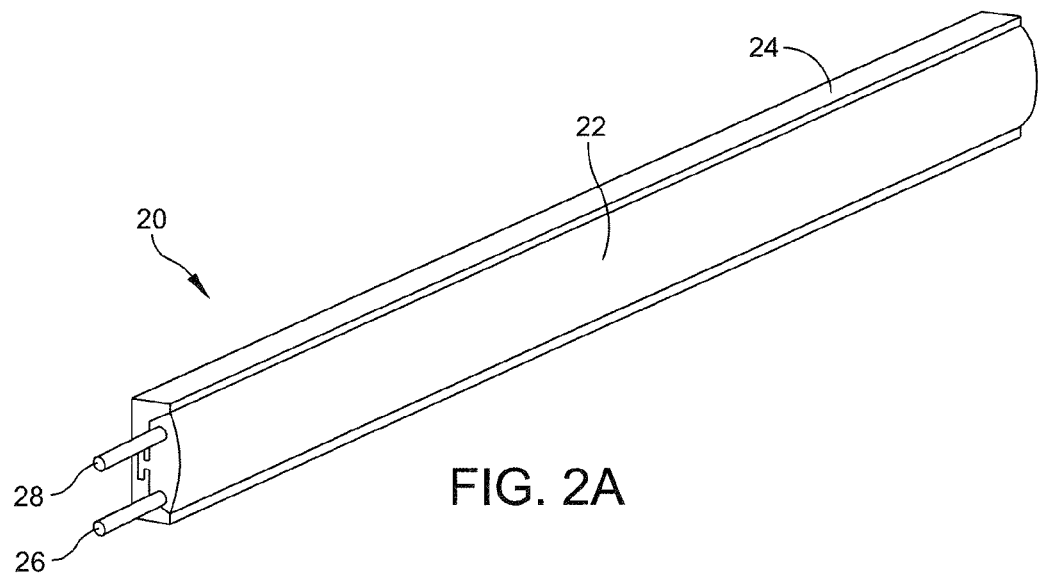
FIG. 2A is a perspective left side view of a card retainer according to an embodiment of the present invention.
Figure 2B:
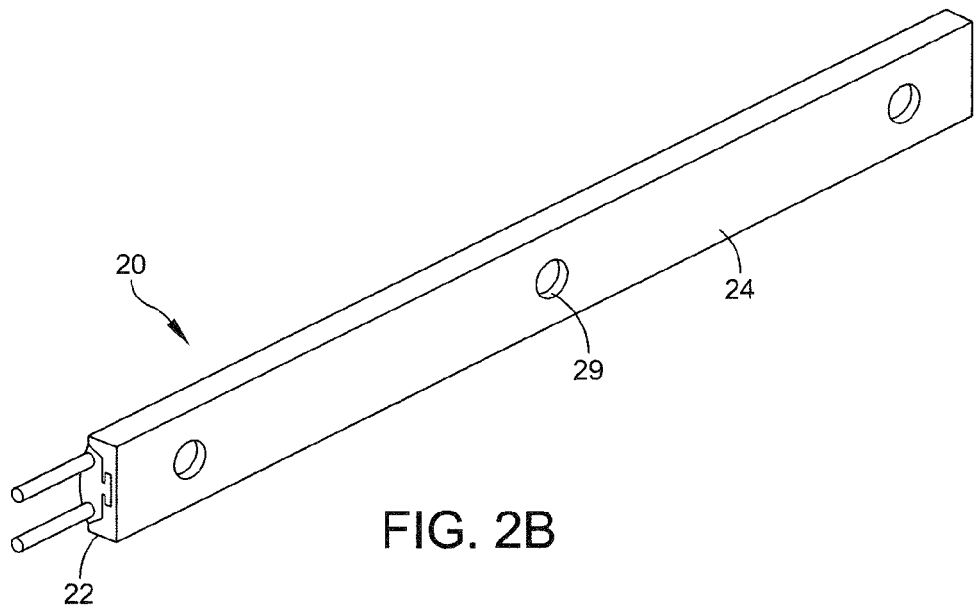
FIG. 2B is a perspective right side view of the card retainer of FIG. 2A.

Referring generally to FIGS. 2A and 2B, an exemplary card retainer according to an embodiment of the present invention is shown. Card retain 20 comprises an elongated bladder 22 mounted to, or otherwise associated with, a corresponding body or frame 24 (e.g. a wedge lock). Bladder 22 comprises an at least partially-hollow construction such that it may be selectively filled with a fluid, such as a gas or a liquid. In the illustrated embodiment, bladder 22 comprises an inlet port 26, and an outlet port 28 for facilitating the introduction of fluid into and out of bladder 22.

Bladder 22 may be generally flexible, such that the introduction of pressurized fluid into a cavity of bladder 22 causes at least a portion of bladder 22 to expand (e.g. in a direction away from frame 24). Expansion of bladder 22 may be attributed to at least one of, for example, the stretching or deformation of at least a portion of a wall of bladder 22, or through a change in the outer dimensions of bladder 22 as it transitions from a generally collapsed, or unfilled state, to an inflated, or filled state without an accompanying stretching of the bladder itself. Thus, bladder 22 may be wholly or partially formed from materials having generally flexible or elastic characteristics, such as rubber or other suitable polymers. The material of bladder 22 may also be selected according to its heat transfer characteristics. In other embodiments, only a portion of bladder 22 may be flexible or elastic. For example, a wall segment of bladder 22 may comprise a generally flexible and/or elastic characteristic, and the remainder of the bladder comprise a more stiff and/or inelastic characteristic, such that pressurization of bladder 22 results in the expansion of generally only the flexible segment thereof. This segment may be formed by, for example, selectively thinning a section of a wall of bladder 22.

Frame 24 may comprise any suitable shape. In the illustrated embodiment, frame 24 comprises an elongated body having a complementary profile formed therein for adjoining with bladder 22 (see FIG. 3). Moreover, frame 24 may comprise features, such as apertures 29 for attaching frame 24 and/or bladder 22 to, for example, a card or a portion of a cooling chassis. Frame 24 may be formed from any suitable material, including metals, metal alloys, composites or polymers. In order to promote heat transfer, it may be advantageous to form frame 24 from a material having high thermal conductivity.

Figure 3:
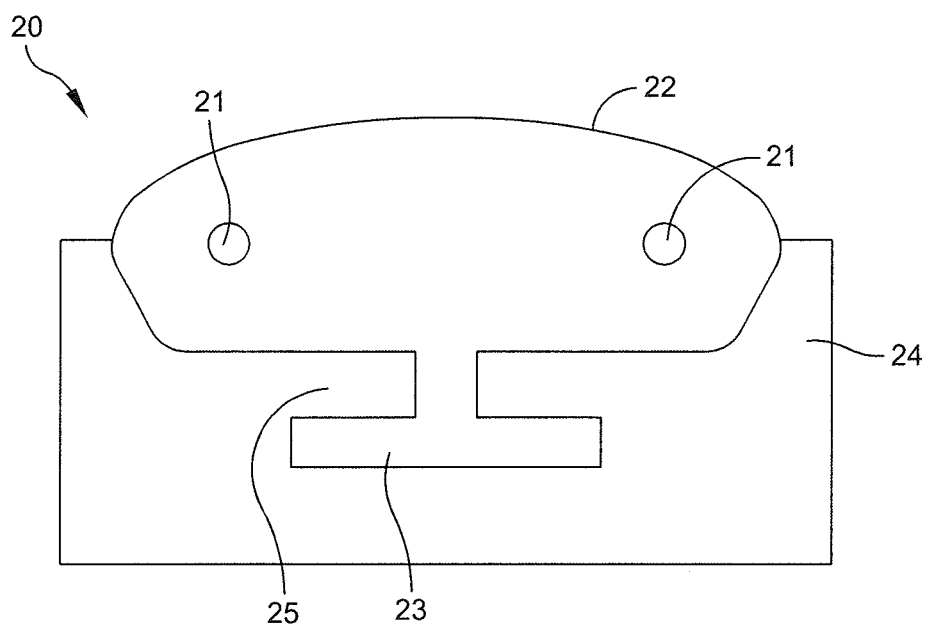
FIG. 3 is a cross-section view of the card retainer of FIGS. 2A-2B.

With reference to FIG. 3, by way of non-limiting example only, bladder 22 may comprise a generally elliptical cross-section, and may be configured to be arranged within a correspondingly-sized recess formed in frame 24. In the exemplary embodiment, bladder 22 and frame 24 are attached via a "T" shaped section 23 formed integrally with bladder 22, and a corresponding T-shaped void or slot formed within frame 24. In this way, bladder 22 and frame 24 may be secured to one another. While an interlocking arrangement is shown, it should be understood that any suitable means, such as other tongue and groove arrangements or fasteners, may be used for attaching or otherwise positioning bladder 22 with respect to frame 24 without departing from the scope of the present invention.

As set forth above, bladder 22 may feature a cavity formed therein in communication with at least one port. In one embodiment, inlet and outlet ports 26,28 feed a generally "U" shaped cavity 21, or a cavity having a generally U-shaped flow pattern. This U-shaped cavity may comprise, for example, one or more passages running a length of bladder 22, which transition into one or more return passages running in an opposite direction, thus creating a counter-flow of fluid through the bladder. These passages may be formed by, for example, creating voids within the bladder material, or by molding internal ribs within a hollow portion of the bladder for directing the flow of fluid therethrough. While a U-shaped cavity or flow pattern is described, it should be noted that any suitable cavity shape, size or flow pattern may be used. Variations in the configuration of the cavity may be desired due to, for example, optimizing cooling characteristics, as well as optimizing the expansion and contraction characteristics of the bladder.

Figure 4A:
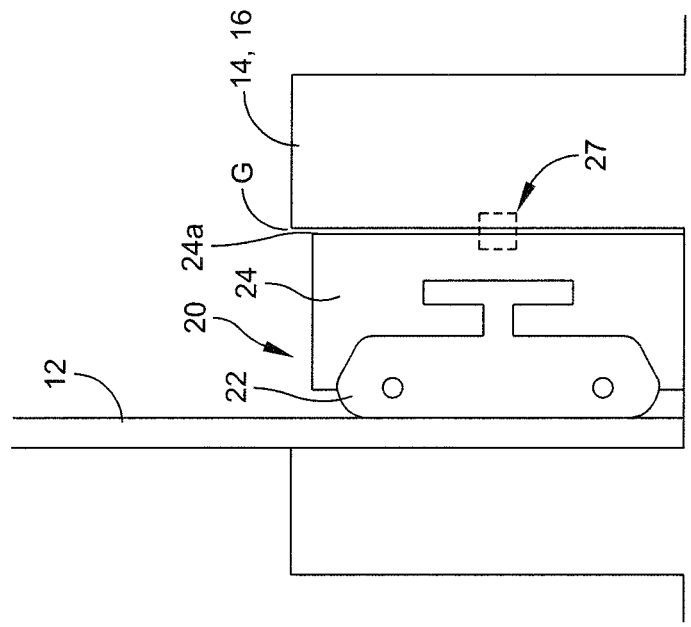
FIG. 4A is a cross-section view illustrating a first functional arrangement of a card retainer according to an embodiment of the present invention.
Figure 4B:
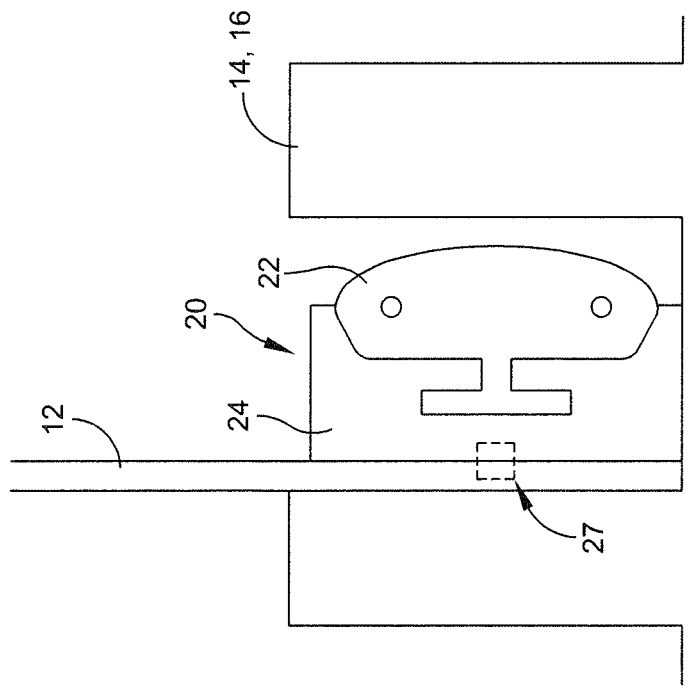
FIG. 4B is a cross-section view of a second functional arrangement of a card retainer according to an embodiment of the present invention.

FIGS. 4A and 4B partially illustrate exemplary implementations of card retainer 20 of FIGS. 2A-3 into a card cooling system. As set forth above with respect to FIG. 1A, card cooling systems may comprise, for example, a cooling chassis 14 having a plurality of slots formed therein via elevated wall sections 16. In operation, a card 12 (only a first end of which is shown) is placed within the slot, along with a corresponding card retainer 20. In the embodiment of FIG. 4A, card retainer 20 is arranged with its frame 24 abutting or facing card 12 on a first side thereof, with a second side of card 12 abutting or facing an elevated section 16 of chassis 14. Bladder 22 of card retainer 20 thus faces an opposing elevated section 16 of chassis 14. In some embodiments, card retainer 20 may be attached to card 12 via a fastener 27, for example, a screw, bolt, or pin. In the exemplary FIG. 4A, bladder 22 is in a collapsed, or unpressurized state. Similarly, FIG. 4B includes a card retainer 20 arranged with its frame 24 abutting or facing wall section 16 of chassis 14, and bladder 22 abutting or facing card 12. In this embodiment, card retainer 20 may be fixed to wall section 16 via a fastener 27. In the exemplary FIG. 4B, bladder 22 is in an expanded, or pressurized state. It is noted that with reference to FIG. 4B, embodiments of the present invention may be implemented such that there may or may not be an actual gap G between the body of the frame 24 and the facing wall section 16 of chassis 14. For example, for purposes of enhancing heat transfer, the structure may alternately be configured such surface edge 24a of frame 24 is in contact engagement with opposing wall 16 along its entire length.

In either embodiment, pressurizing bladder 22 via, for example, inlet port 26 (FIGS. 2A-2B) causes its expansion, clamping card 12 between walls 16 of chassis 14 (FIG. 4B). Likewise, card 12 may be unclamped by a corresponding depressurization of bladder 22 (FIG. 4A). A desired clamping force placed on card 12 by bladder 22 may be selectively altered by controlling the pressure of the fluid within bladder 22. In the case of a bladder comprising an inlet and outlet port, the fluid pressure may be controlled by, for example, controlling the flow rate of the fluid into and/or out of the bladder. This may include adjusting the source of the pressurized fluid, and/or utilizing a flow restriction in the outlet port of the bladder, such as a fixed orifice, an in-line adjustable valve, or through the use of an outlet port or an associated connection (e.g. an outlet line) having a smaller diameter than the inlet port.

Figure 5A:
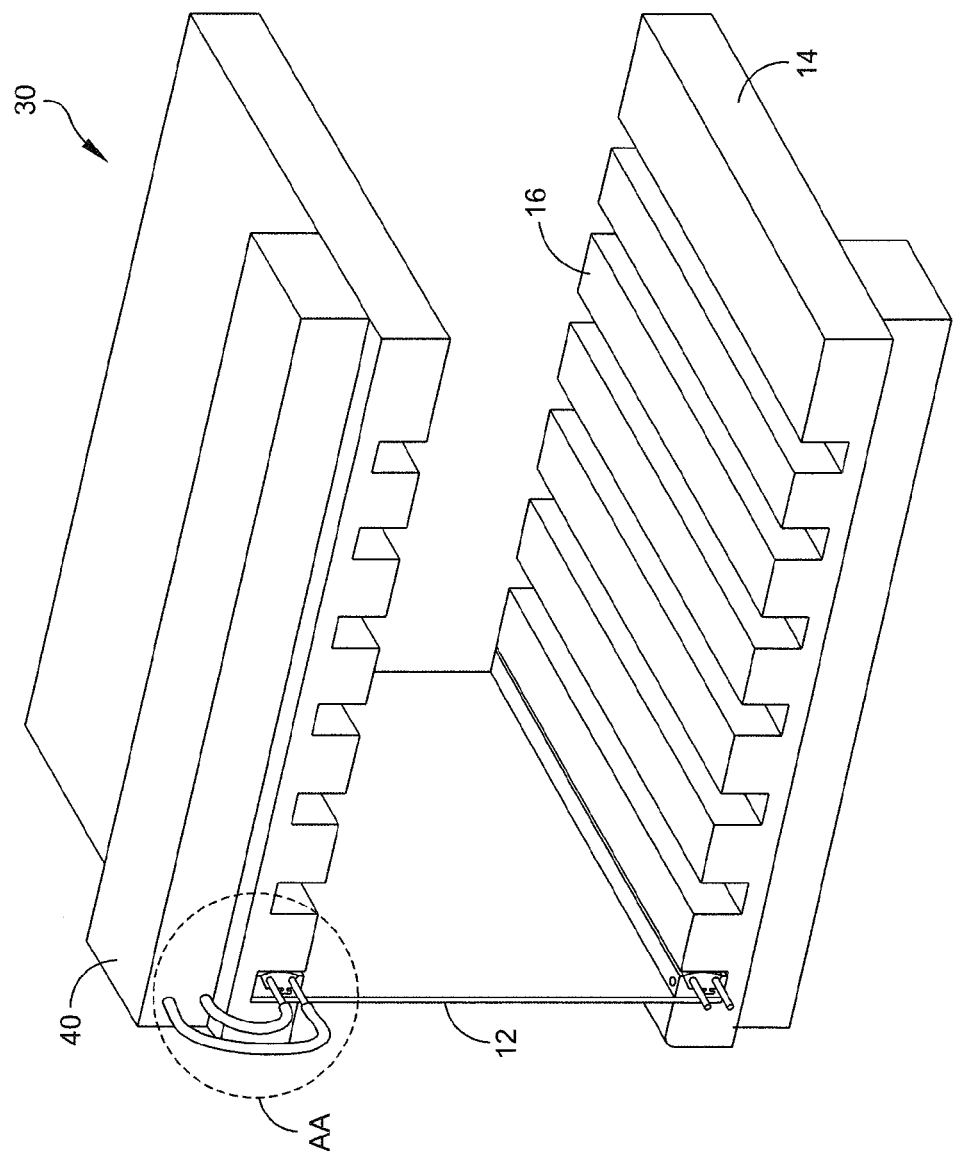
FIG. 5A is a perspective view of a cooling system utilizing card retainers according to embodiments of the present invention.
Figure 5B:
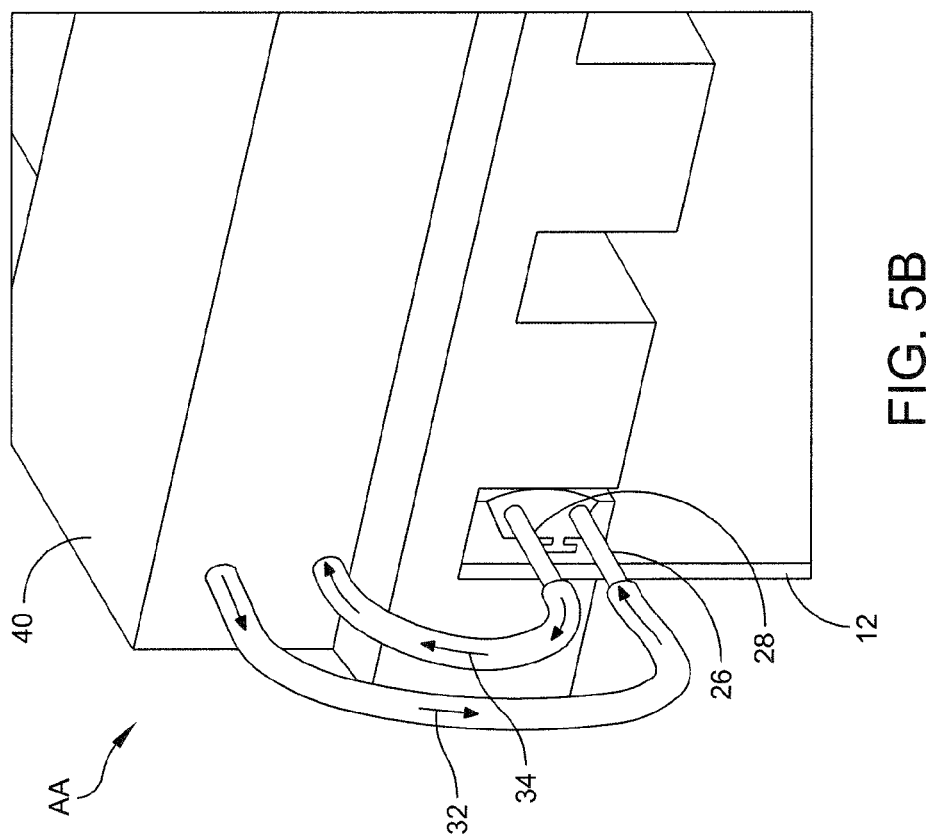
FIG. 5B is a detailed perspective view of section AA of FIG. 5A.

Referring generally to FIGS. 5A and 5B, a card cooling system 30 is shown according to an embodiment of the present invention. System 30 may comprise a cooling chassis 14 having upper and lower cold wall portions. As set forth above, elevated walls 16 may define a plurality slots arranged between upper and lower cold wall portions for accepting cards 12 therein. Chassis 14 and/or walls 16 may comprise, for example, internal cooling passages (not shown) for carrying air, water, or other types of coolant therethrough. System 30 also includes, for example, a heat exchanger 40 which may include one or more pumps (not shown) for supplying pressurized fluid (e.g. coolant) to each card retainer. Heat exchanger 40 may be arranged in thermal contact with cooling chassis 14 for providing additional cooling to the system.

In the exemplary embodiment, heat exchanger 40 comprises an outlet supply line 32 for providing pressurized fluid to the inlet port 26 of the card retainer, as well as an inlet line 34 for receiving a return flow of fluid from outlet port 28 of card retainer 20. In this way, a circular flow of coolant or fluid is provided. Thus, in the illustrated embodiment, the fluid serves as both a pressure source to expand the bladder of the card retainer and force the card against the chassis wall, as well as a source of cooling fluid into which heat from the card will be absorbed. Thus, embodiments of the card retainer described herein may offer improved cooling capabilities over systems of the prior art.

While system 30 illustrates only a single card and card retainer supplied by a single heat exchanger, it should be understood that systems according to embodiments of the present invention will include provisions for multiple cards. Thus, for example, any number of heat exchanges, manifolds for distributing pressurized fluids to a plurality of card retainers, and various associated pumps and pressure regulating devices may be included in systems according to embodiments of the present invention. Moreover, it should be understood that control systems may be provided. A control system may comprise, for example, only mechanical valves for controlling the flow of pressurized fluid to the card retainers. Other control systems may be automated, or semi-automated, and include at least one temperature sensor for monitoring the temperature of the fluid or the cards. The system may be responsive to the output of the sensor for varying the temperature of the fluid (e.g. via the heat exchanger), thus controlling the operating temperature of the cards. The system may also include at least one pressure sensor for monitoring the pressure of the fluid within the system. The output of the pressure sensor may be input to the system, and used by the system to adjust the clamping force on the cards, or to adjust the flow of fluid through the retainers.

Figure 6:
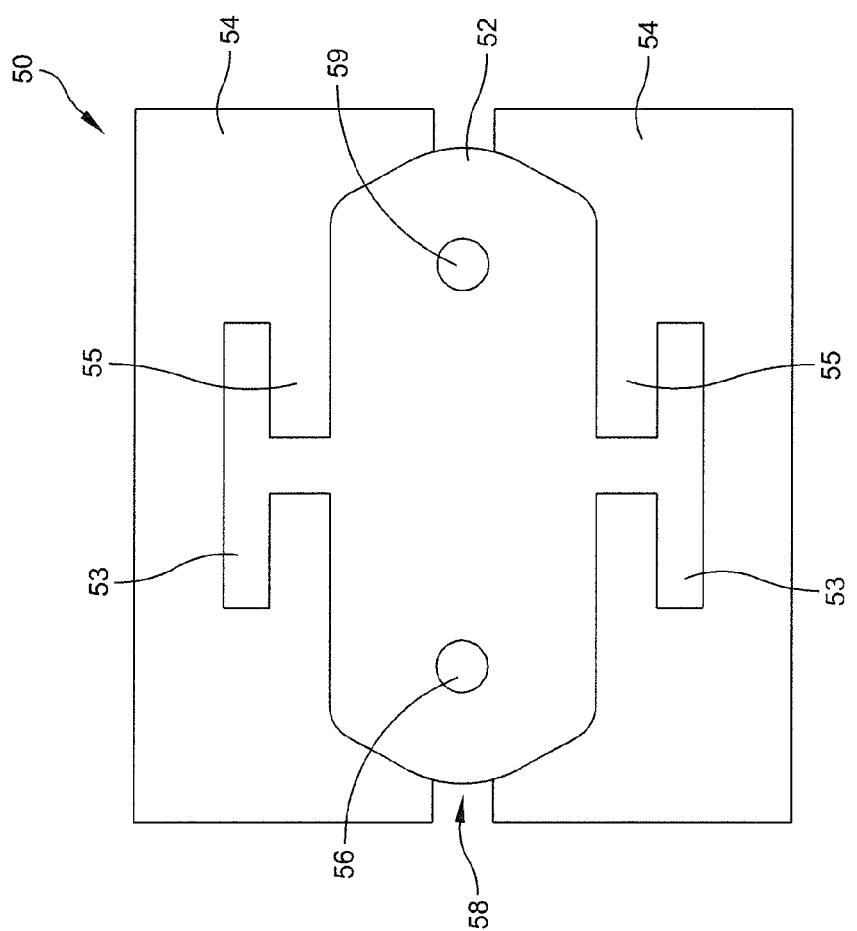
FIG. 6 is a cross-section view of a card retainer according to another embodiment of the present invention.

Moreover, embodiments of the present invention have been shown and described in only exemplary configurations, with many alternate arrangements contemplated and falling within the scope of the present invention. For example, FIG. 6 shows a card retainer 50 having a bladder 52 arranged between first and second frames 54. As set forth above, bladder 52 may be attached to frames 54 via complementary, interlocking features 53,55. Likewise bladder 52 may comprise a cavity having passages 56,59 formed therein for allowing the passage of fluid therethrough, or for storing a volume of fluid therein. As set forth above, bladder 52 may be expanded, thus increasing the gap 58 between frames 54, and applying pressure to, for example, a card and wall of a cooling chassis arranged on either outer sides of frames 54. In the exemplary embodiment, bladder 52 may be designed to have an elastically deformable or collapsible wall portion only in the area of gap 58. Further, frames 54 may be attached via guide pins, ensuring the frames maintain proper alignment during expansion/contraction. These guide pins may also serve as conduits for additional heat transfer between the frames.

It is envisioned that embodiments of the present invention may comprise frames and bladders of any size or configuration, rather than simply the elongated bladder and frame arrangements shown. Further, card retainers according to embodiments of the present invention may not require any form of frame, and may substantially comprise only a bladder in selective communication with a source of pressurized fluid. Further still, while embodiments of a bladder having two fluid ports have generally been shown and described, it should be noted that bladders having a single port, or more than two ports, may be used without departing from the scope of the present invention. In any of the embodiments, pressurized fluid may be provided by any source, including one or more pumps in communication with a fluid reservoir, and may function with or without a heat exchanger.

Embodiments of the present invention offer several advantages over card retainers of the prior art. For example, because the force exerted between the card retainer and the card results from fluid applying pressure over a generally uniform area, the force exerted on the card will be relatively uniform. Thus, the card will be held with uniform friction across its edges. Further, the bladder will conform to any irregular surfaces of the chassis or card when pressurized, further evening contact pressures. The flexible bladder, by nature, is also less likely to cause damage to the chassis of the cooling system and/or the cards during installation and removal processes. The possibility of the card retainer "sticking", or not releasing, is also eliminated, as once fluid pressure is reduced, there is no mechanism by which the bladder may continue to apply a force on the card.

Further still, due to the cooling ability of the bladder, heat is removed from both sides of the card, as opposed to a single side in conventional card retainers. Moreover, because coolant can be brought as close as possible to the card edges (i.e. as close as the thickness of the bladder), thermal resistance between the card and the coolant is greatly reduced compared to systems of the prior art featuring only coolant running through the cooling chassis. The thermal resistance can further be kept at a minimum, or otherwise controlled, by altering the thickness and/or composition of the bladder material, consistent with the desired pressure.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A device for selectively retaining a printed wire board within a chassis comprising:
   an expandable bladder comprising a cavity formed therein for holding a volume of fluid, the cavity in communication with an inlet port; and
   a frame associated with the bladder for supporting the bladder within the chassis,
   wherein the inlet port is configured to communicate with a source of pressurized fluid for selectively expanding and contracting the bladder, and
   wherein the bladder and the frame are attached via a complementary tongue and groove arrangement.

2. The device of claim 1, wherein the tongue and groove arrangement comprises a T-shaped tongue formed on the bladder and a corresponding T-shaped groove formed in the frame.

3. The device of claim 1, wherein the frame comprises at least one aperture for attaching to one of the printed wire board or the chassis.

4. A device for selectively retaining a printed wire board within a chassis comprising:
   an expandable bladder comprising a cavity formed therein for holding a volume of fluid, the cavity in communication with an inlet port for communicating with a source of pressurized fluid for selectively expanding and contracting the bladder, and
   a frame for supporting the bladder within the chassis,
   wherein the frame comprises a recess formed therein for joining with the bladder, and
   wherein the recess comprises a complementary profile to that of the bladder.

5. The device of claim 1, wherein the bladder comprises an outlet port.

6. The device of claim 5, wherein the cavity comprises at least one passage providing for the flow of fluid from the inlet port in a first direction, the passage returning the fluid in a second direction, opposite the first direction, to the outlet port.

7. A circuit card retaining system comprising:
   a source of pressurized fluid, and
   a card retainer comprising an expandable bladder having an inlet port for providing pressurized fluid to a cavity formed within the bladder,
   wherein the cavity comprises at least one passage providing for the flow of fluid from the inlet port in a first direction through the bladder, the passage returning the fluid in a second direction through the bladder, opposite the first direction, for creating a counter-flow of fluid through the bladder to an outlet port for allowing pressurized fluid out of the bladder.

8. The system of claim 7, further comprising a heat exchanger for controlling the temperature of the fluid provided to the bladder.

9. The system of claim 7, herein the inflatable bladder is attached to a corresponding frame for positioning the bladder relative to the card.

10. A method for retaining a circuit card within a chassis comprising:
    attaching an expandable bladder to a frame by engaging the bladder within a recess formed in the frame having a complementary profile to that of the bladder, the frame configured to position the bladder relative to a circuit card arranged within the chassis,
    pressurizing a volume of fluid, and
    filling an expandable bladder with the pressurized fluid;
    wherein filling of the bladder causes its expansion, clamping a circuit card within a chassis.

11. The method of claim 10, wherein the fluid comprises a liquid coolant.

12. The method of claim 10, wherein the step of filling the expandable bladder comprises providing the pressurized fluid to an inlet port of the bladder.

13. The method of claim 12, wherein the expandable bladder comprises an outlet port for providing a flow of pressurized fluid out of the bladder.

14. The method of claim 13, further comprising the step of controlling the temperature of the fluid with a heat exchanger.

15. The method of claim 10, further comprising the step of reducing the volume of fluid within the bladder, unclamping the circuit card from the chassis.

* * * * *